US011551750B2

United States Patent
Hekmatshoartabari et al.

(10) Patent No.: US 11,551,750 B2
(45) Date of Patent: Jan. 10, 2023

(54) ENHANCED STATE DUAL MEMORY CELL

(71) Applicant: INTERNATIONAL BUSINESS MACHINES CORPORATION, Armonk, NY (US)

(72) Inventors: Bahman Hekmatshoartabari, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/118,952

(22) Filed: Dec. 11, 2020

(65) Prior Publication Data

US 2022/0189543 A1 Jun. 16, 2022

(51) Int. Cl.
*G11C 11/00* (2006.01)
*G11C 11/54* (2006.01)
(Continued)

(52) U.S. Cl.
CPC .......... *G11C 11/54* (2013.01); *G11C 11/1673* (2013.01); *G11C 11/1675* (2013.01);
(Continued)

(58) Field of Classification Search
CPC . G11C 11/54; G11C 11/1673; G11C 11/1675; G11C 13/004; G11C 13/0069; G11C 13/0097; G11C 11/1659; G11C 2213/79; G11C 2213/82; G11C 11/5678; G11C 13/003; G11C 11/5607; G06N 3/04; G06N 3/08
See application file for complete search history.

(56) References Cited

U.S. PATENT DOCUMENTS 8,045,361 B2 10/2011 Lee
8,064,248 B2 11/2011 Lung
(Continued)

FOREIGN PATENT DOCUMENTS

WO 2022122372 A1 6/2022

OTHER PUBLICATIONS

Bocquet et al., "In-Memory and Error-Immune Differential RRAM Implementation of Binarized Deep Neural Networks", International Electron Devices Meeting (IEDM), 2018, pp. 20.6.1-20.6.4.
(Continued)

*Primary Examiner* — Hien N Nguyen
(74) *Attorney, Agent, or Firm* — L. Jeffrey Kelly

(57) ABSTRACT

A circuit may include a memory cell. The memory cell may include a first memory element, a second memory element, a first transistor, and a second transistor. The first memory element may be connected to a bit line. The second memory element may be connected to a select line. The first transistor may be connected to a first word line. The second transistor may be connected to a second word line. The first memory element may be programmed by applying a first write voltage to the bit line, applying a second write voltage to the second word line, applying a first intermediate voltage to the select line, and applying a second intermediate voltage to the first word line. The select line may be connected to a high impedance. The first write voltage may be a positive supply voltage, the second write voltage may be a negative supply voltage.

17 Claims, 6 Drawing Sheets

(51) Int. Cl.
  G11C 11/16   (2006.01)
  G11C 13/00   (2006.01)
  *G06N 3/04*     (2006.01)
  *G06N 3/08*     (2006.01)

(52) U.S. Cl.
  CPC ........ G11C 13/004 (2013.01); G11C 13/0069 (2013.01); G11C 13/0097 (2013.01); *G06N 3/04* (2013.01); *G06N 3/08* (2013.01)

(56) References Cited

U.S. PATENT DOCUMENTS

| | | | |
|---|---|---|---|
| 9,076,523 | B2 | 7/2015 | Lee |
| 9,178,000 | B1 | 11/2015 | Nardi |
| 9,831,288 | B2 | 11/2017 | Grenouillet |
| 10,269,869 | B1 | 4/2019 | Ando |
| 10,374,039 | B1 | 8/2019 | Hashemi |
| 2008/0084724 | A1* | 4/2008 | Nozieres ............. G11C 11/1673 365/158 |
| 2018/0144240 | A1* | 5/2018 | Garbin ..................... G06N 3/04 |

OTHER PUBLICATIONS

Kaplan et al., "A Resistive CAM Processing-in-Storage Architecture for DNA Sequence Alignment." Architectures for the Post-Moore Era, Published by the IEEE Computer Society, © 2017 IEEE, pp. 2-10.

Wang et al., "Training Deep Neural Networks with 8-bit Floating Point Numbers," 32nd Conference on Neural Information Processing Systems (NeurIPS 2018), Montreal, Canada, 11 pages.

Bi et al., "Total ionization dose and single event effects of a commercial stand-alone 4 Mb resistive random access memory (ReRAM)", Microelectronics Reliability, vols. 100-101, Sep. 2019, 113443, ScienceDirect, 3 pages.

Chen et al., "Reconfigurable 2T2R ReRAM with Split Word-lines for TCAM Operation and In-Memory Computing", © 2020 IEEE, 5 pages.

Notification of Transmittal of the International Search Report and the Written Opinion of the International Searching Authority, or the Declaration, dated Mar. 24, 2022, International application No. PCT/EP2021/082612, 14 pages.

* cited by examiner

ENHANCED STATE DUAL MEMORY CELL

BACKGROUND

The present invention relates generally to a memory array structure and a method of programming the same. More particularly, the present invention relates to a memory array structure that includes an enhanced state dual memory cell.

Deep learning is a machine learning method based on artificial neural networks inspired by information processing in biological systems. Deep learning may be used in a wide spectrum of applications, including image processing, machine translation, speech recognition, and many others. In each of these domains, deep neural networks achieve superior accuracy through the use of very large and deep models. These deep models may include reduced-precision methods for data representation and computation.

SUMMARY

According to one embodiment of the present invention, a circuit is provided. The circuit may include a memory array. The memory array may include a plurality of bit lines, a plurality of word lines, a plurality of select lines. The plurality of bit lines and the plurality of select lines may intersect the plurality of word lines. The memory array may include a plurality of memory cells each including a first transistor, a second transistor, a first memory element, and a second memory element. The first and second memory elements may be connected to the plurality of word lines by way of the first and second transistors. The first and second memory elements may be connected to the plurality of bit lines and the plurality of select lines. The first transistor and the second transistor may be a complementary pair of bipolar junction pass transistors. The complementary pair of bipolar junction pass transistors may include an NPN bipolar junction pass transistor and a PNP bipolar junction pass transistor. The first transistor and the second transistor may be a complementary pair of junction field-effect transistors. The complementary pair of junction field-effect transistors may include an n-channel junction field-effect transistor and a p-channel junction field effect-transistor. The first memory element may be connected between one of the plurality of bit lines and a first shared collector emitter or source drain terminal of the complementary pair. The second memory element may be connected between one of the plurality of select lines and a second shared collector emitter or source drain terminal of the complementary pair. The second transistor in the one of the plurality of memory cells and a transistor of an opposite channel type in a memory cell adjacent to the one of the plurality of memory cells may have a base or a gate terminal connected to a same one of the plurality of word lines. The first memory element and the second memory element may be a phase-change memory, a resistive random access memory, or a magnetic random access memory. The first memory element and the second memory element may have same characteristics and the first memory element and the second memory element may be programmable to N states and the memory cell is programmable to $$\frac{N(N+1)}{2}$$

states. The first memory element and the second memory element may have different characteristics and the first memory element and the second memory element may be programmable to N states and the memory cell is programmable to $N^2$ states.

According to another embodiment of the present invention, a circuit is provided. The circuit may include a memory cell. The memory cell may include a first memory element, a second memory element, a first transistor, and a second transistor. The first memory element may be connected to a bit line. The second memory element may be connected to a select line. The first transistor may be connected to a first word line, and the second transistor may be connected to a second word line. The first memory element may be programmed by applying a first write voltage to the bit line, applying a second write voltage to the second word line, applying a first intermediate voltage to the select line, and applying a second intermediate voltage to the first word line. The select line may be connected to a high impedance. The first write voltage may be a positive supply voltage, the second write voltage may be a negative supply voltage, and the first and second intermediate voltages may be ground voltages. The first write voltage may be greater than the first intermediate voltage, the first intermediate voltage may be greater than or equal to the second intermediate voltage, and the second intermediate voltage may be greater than the second write voltage. The first memory element may be erased by applying a first erase voltage to the first word line, applying a second erase voltage to the bit line, applying a first intermediate voltage to the select line, and applying a second intermediate voltage to the second word line. The first erase voltage may be a positive supply voltage, the second erase voltage may be a negative supply voltage, and the first and second intermediate voltages may be ground voltages. The first erase voltage may be greater than the first intermediate voltage, the first intermediate voltage may be greater than or equal to the second intermediate voltage, and the second intermediate voltage may be greater than the second erase voltage. The first transistor and the second transistor may be a complementary pair of bipolar junction pass transistors. The complementary pair of bipolar junction pass transistors may include an NPN bipolar junction pass transistor and a PNP bipolar junction pass transistor. The first transistor and the second transistor may be a complementary pair of junction field-effect transistors. The complementary pair of junction field-effect transistors may include an n-type junction field-effect transistor and a p-type junction field effect-transistor. The first memory element and the second memory element may be a phase-change memory, a resistive random access memory, or a magnetic random access memory.

According to another embodiment of the present invention, a method of reading a memory cell within a memory array is provided. The method may include applying a first read voltage of a first pair of read voltages to a bit line, applying a second read voltage of the first pair of read voltages to a select line connected to a second memory element, applying a first read voltage of a second pair of read voltages to a first word line, applying a second read voltage of the second pair of read voltages to a second word line, and applying an intermediate voltage to rest of bit lines, word lines, and select lines within the memory array. The bit line may be connected to a first memory element. The first word line may be connected to a first transistor. The second word line may be connected to a second transistor. The first transistor and the second transistor may be a complimentary pair of bipolar junction pass transistors. The first transistor may be an NPN bipolar junction pass transistor and the second transistor may be a PNP bipolar junction pass transistor. The first word line may be connected to a base of the NPN bipolar junction pass transistor and the second word line may be connected to a base of the PNP bipolar junction pass transistor. The first transistor and the second transistor may be a complementary pair of junction field-effect transistors. The first transistor may be an n-channel junction field-effect transistor and the second transistor may be a p-channel junction field effect transistor. The first word line may be connected to a gate of the n-channel junction field-effect transistor and the second word line may be s connected to a gate of the p-channel junction field-effect transistor. The first read voltage of the first pair of read voltages may be greater than the first read voltage of the second pair of read voltages, the first read voltage of the second pair of read voltages may be greater than the intermediate voltage, the intermediate voltage may be greater than the second read voltage of the second pair of read voltages, and the second read voltage of the second pair of read voltages may be greater than the second read voltage of the first pair of read voltages. The first read voltages of the first and second pair of read voltages may be positive voltage, and the second read voltages of the first and second pair of read voltages may be negative voltages, the second read voltages may have same amplitude as the first read voltages, and the intermediate voltage may be a ground voltage.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
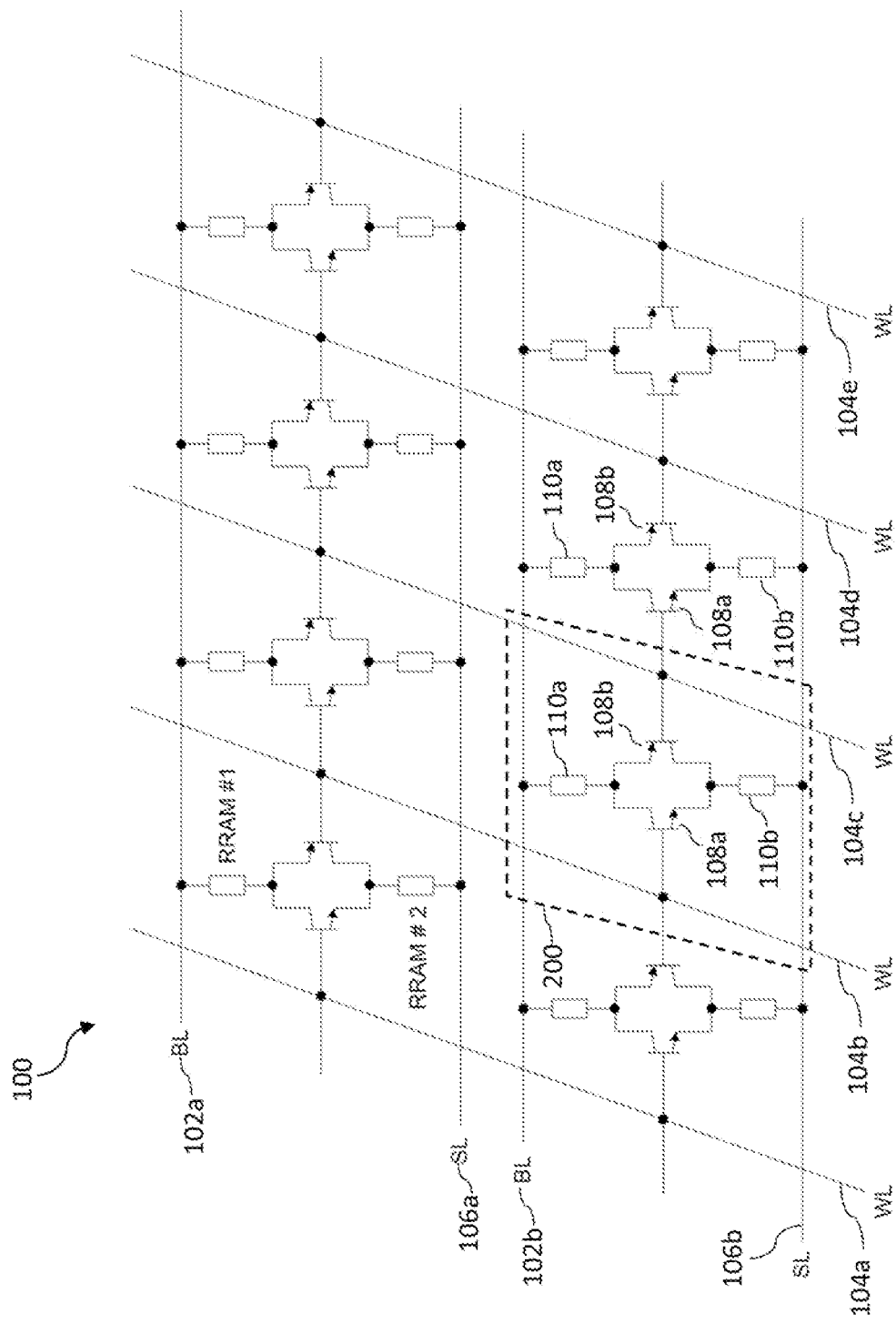
FIG. 1 is a simplified circuit diagram of memory array of analog memory cells according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Deep learning is a machine learning method based on artificial neural networks. Deep learning may be used in a wide spectrum of applications, including image processing, machine translation, speech recognition, and many others. In each of these domains, deep neural networks achieve superior accuracy through the use of very large and deep models. These deep models may include reduced-precision methods for data representation and computation. Computation for deep neural networks may include both training and forward inference.

Multiplication operations (including convolution and matrix multiplication) are one of the most area and power consuming components in hardware implementation of deep neural networks. Recent advances in reduced-precision optimization suggest that at least a portion of the multiplication operations may be performed at lower precision. This means that the multiplication operations may be performed with a fewer number of bits, without compromising the end-to-end accuracy. This provides opportunities for power and/or area savings by employing analog devices such as resistive random access memory (RRAM) for weight storage. Further, it is desirable to employ analog devices (i.e. memory elements) with multiple (more than two) states, to increase the memory density for a given memory cell or a given memory design.

Conventional memory elements, in practice, are dual state, because they either have a state 0 or a state 1. These conventional memory elements cannot have more than two states because of reliability issues. As a result, conventional memory elements may be limited by the practical number of states (typically two).

In theory, increasing the number of memory elements per cell may increase the effective number of states per cell. For example, having two memory elements in each memory cell may increase the number of states from two states to four states, given that each memory element has two states. The two memory elements may be combined to obtain four states by using mathematical permutations of their two states. For example, if the first memory element has a state 0, and the second memory element has a state 0, then the combination of the two memory element states may provide memory cell State 1. If the first memory element has a state 0 and the second memory element has a state 1, then the combination of the two memory element states may provide memory cell State 2. If the first memory element has a state 1 and the second memory element has a state 0, then the combination of the two memory element states may provide memory cell State 3. If the first memory element has a state 1 and the second memory element has a state 1, then the combination of the two memory element states may provide memory cell State 4.

In practice however, additional circuitry and processors such as, for example, transistors, are needed to combine the states of two or more memory elements in a useable way that may then be deployed. Having additional transistors, and corresponding wires, may increase the footprint of the circuit thus reducing memory density. The result may be a single memory cell that includes more than two states but whose footprint is larger than two memory cells, where each cell has two states. As such, there exists a need for a memory cell that includes more than two states and that is smaller than the footprint of two memory cells combined.

Embodiments of the present invention provide a new circuit structure. The new circuit structure is a cross-point memory array that includes a plurality of enhanced state dual memory cells. Each of the dual memory cells includes two transistors and two memory elements. As such, the memory cell may also be referred to as a 2T2R cell. The cross-point memory array, having a plurality of the 2T2R cells may increase the effective number of states per cell when compared to a conventional memory array. In an embodiment, the transistors within the memory cell are configured as complementary pass gates (transmission gates). In an embodiment, the memory cells are configured as RRAM/pass-gate/RRAM vertically-stacked structures thus minimizing the cell footprint and achieving a high density of bits per area.

FIGS. 1-6 illustrate an exemplary circuit structure that includes a plurality of memory cells. Each memory cell includes two transistors integrated with two memory elements.

Referring now to FIG. 1, a memory array 100 is shown, in accordance with an embodiment. Although the memory array 100 includes two rows and four columns, it should be appreciated that embodiments of the present invention may include the memory array 100 with any number of rows and columns. The memory array 100 includes a plurality of bit lines 102, a plurality of word lines 104, a plurality of select lines 106. The bit lines 102 and select lines 106 run parallel to each other and are perpendicular to the word lines 104. The plurality of word lines 104 intersect the plurality of bit lines 102 and the plurality of select lines 106. The memory array 100 also includes a plurality of memory cells 200. Each memory cell 200 includes a complimentary pair of transistors 108a, 108b, a first memory element 110a, and a second memory element 110b. Although eight memory cells 200 are shown, it should be appreciated that embodiments of the present invention may include any number of memory cells 200.

As stated above, each memory cell 200 includes a complimentary pair of transistors 108a, 108b. The transistors 108a, 108b may be bipolar junction transistors (BJTs) or junction field-effect transistors (JFETs). In a preferred embodiment, the transistors 108a, 108b are a complimentary pair of BJTs such that transistor 108a is an NPN type and transistor 108b is a PNP type. In an alternative embodiment, the transistors 108a, 108b are a complimentary pair of JFETs such that transistor 108a is an n-channel JFET (nJFET) and transistor 108b is a p-channel JFET (pJFET). In an embodiment, the transistors 108a, 108b are configured as complementary transmission gates. In an embodiment, the transistor 108b in the memory cell 200 and the transistor 108a in a memory cell adjacent to the memory cell 200 have a base or a gate terminal connected to the same respective word line 104b. The transistor 108a is an opposite channel type than the transistor 108b.

The first and second memory elements 110a, 110b may be any type of memory element such as, for example, RRAM, phase change memory, magnetic random access memory, or the like. The first memory element 110a is connected between the bit line 102a and a first shared collector emitter terminal (in BJT embodiments) or source drain terminal (in JFET embodiments) of the complimentary pair of transistors 108a, 108b. The second memory element 110b is connected between the select line 106a and a second shared collector emitter or source drain terminal of the complimentary pair of transistors 108a, 108b.

Figure 2:
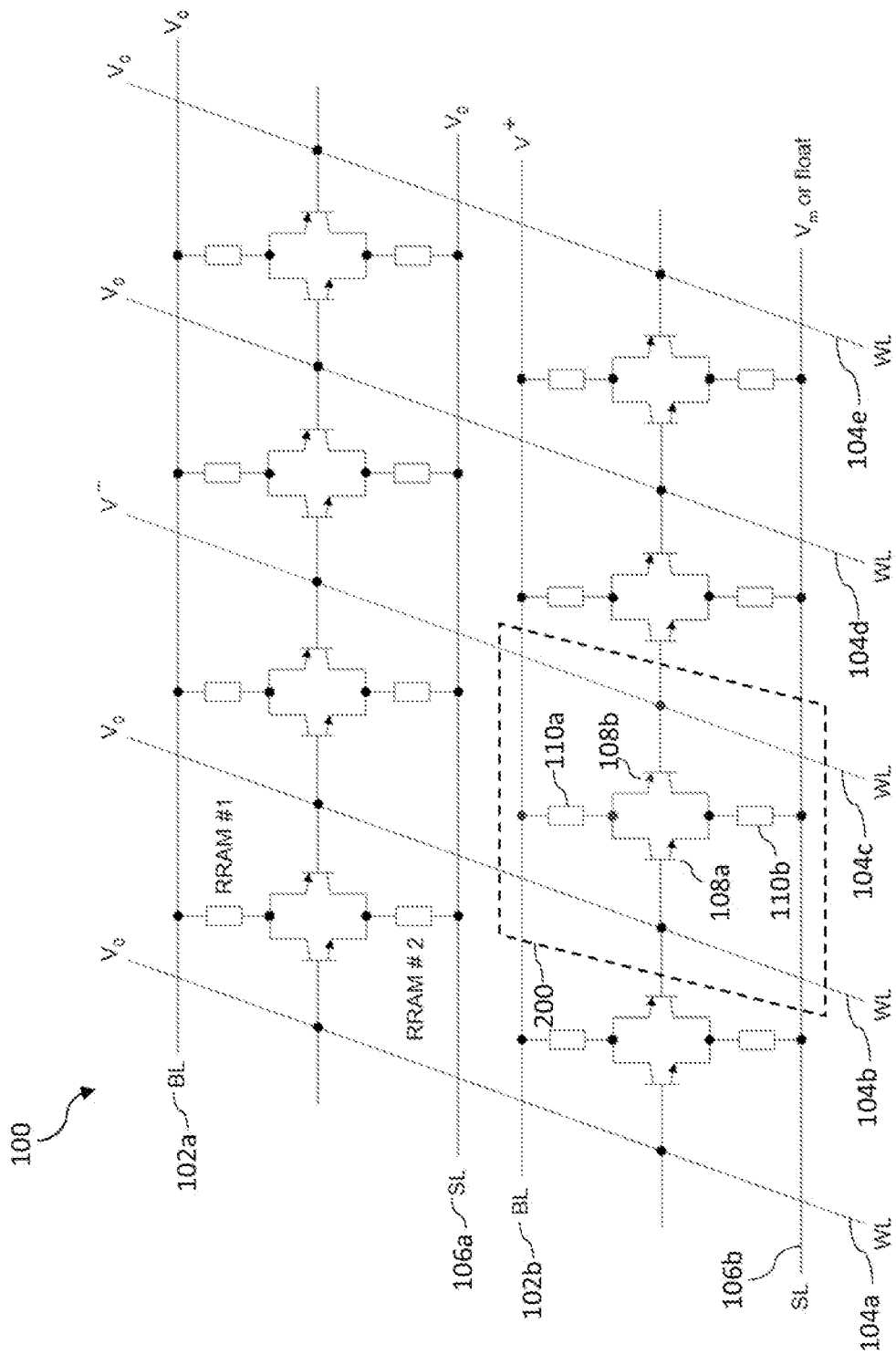
FIG. 2 is simplified circuit diagram of a programming operation of a first memory element within the memory array according to an exemplary embodiment.

Referring now to FIG. 2, an example of a programming, or writing, operation of the first memory element 110a within the memory array 100 is shown, in accordance with an embodiment. Embodiments of the present invention provide a method of programming the first memory element 110a without substantially disturbing the second memory element 110b within the memory cell 200. During the programming operation, resistance of the first memory element 110a is decreased to create the programmed state of the memory element (which may be referred to as, for example, 1).

To program the first memory element 110a, a first write voltage is applied to the bit line 102b that is connected to the first memory element 110a. In an embodiment, the word line 104c is connected to the base of the PNP transistor 108b. In an alternative embodiment, the word line 104c is connected to the gate of the pJFET transistor 108b. The first write voltage is a positive supply voltage $V^+$. A second write voltage is applied to the word line 104c. The second write voltage is a negative supply voltage $V^-$. The first write voltage is sufficiently larger than the second write voltage to forward bias the base or the gate junction of the transistor 108b, allowing for the first memory element 110a to be selected to be programmed. For example, if the voltage drop across the forward biased junction is approximately 0.7 volts (typical for a silicon p-n junction), the program voltage selectively applied across the first memory element 110a will be approximately $V^+-V^--0.7$ volts.

During the programming of the first memory element 110a as described above, in order to minimize disturbing the second memory element 110b as well as all other memory elements in the rest of memory cells, a first and second intermediate voltages may be applied to certain parts of the memory array 100. In an embodiment, the first intermediate voltage is applied to the select line 106b that is connected to the second memory element 110b. In an alternative embodiment, the select line 106b is connected to a high impedance. The second intermediate voltage is applied to the remaining bit lines 102, word lines 104, and select lines 106. For example, as illustrated in FIG. 2, the select line 106b may either be connected to the first intermediate voltage $V_m$ or to a float, which refers to the high impedance. The second intermediate voltage, $V_0$, is applied to the bit line 102a, the select line 106a, and the word lines 104a, 104b, 104d, and 104e. As stated above, the first write voltage $V^+$ is applied to the bit line 102b and the second write voltage $V^-$ is applied to the word line 104c. In this example, voltages are chosen as follows:

$$V^+ > V_m \geq V_0 > V^-$$

As such, the first write voltage is greater than the first intermediate voltage, the first intermediate voltage is greater than or equal to the second intermediate voltage, and the second intermediate voltage is greater than the second write voltage. As a result, the bias voltages across all memory elements except the first memory element 110a are either negligible, or sufficiently smaller than $V^+ - V^-$ to not substantially alter their states. In one embodiment, $V_m$ and $V_0$ are both 0 volts (i.e. ground potential). In another embodiment, $V^+ = -V^-$. In yet another embodiment, the bit line 102a and/or the select line 106a are connected to a float (high impedance) instead of $V_0$. Further variations and bias configurations may also be contemplated.

As stated above, during the programming operation of the first memory element 110a, current flows through the first memory element 110a and the emitter-base or source-gate junction of transistor 108b. The transistor 108b acts as a two-terminal device during this operation. By choosing the different write and intermediate voltages, described above, the first memory element 110a may be programmed to a desired value without disturbing the second memory element 110b within the memory cell 200 or any other memory elements within the other memory cells within the memory array 100. As a result, the first memory element 110a programmed independently.

Figure 3:
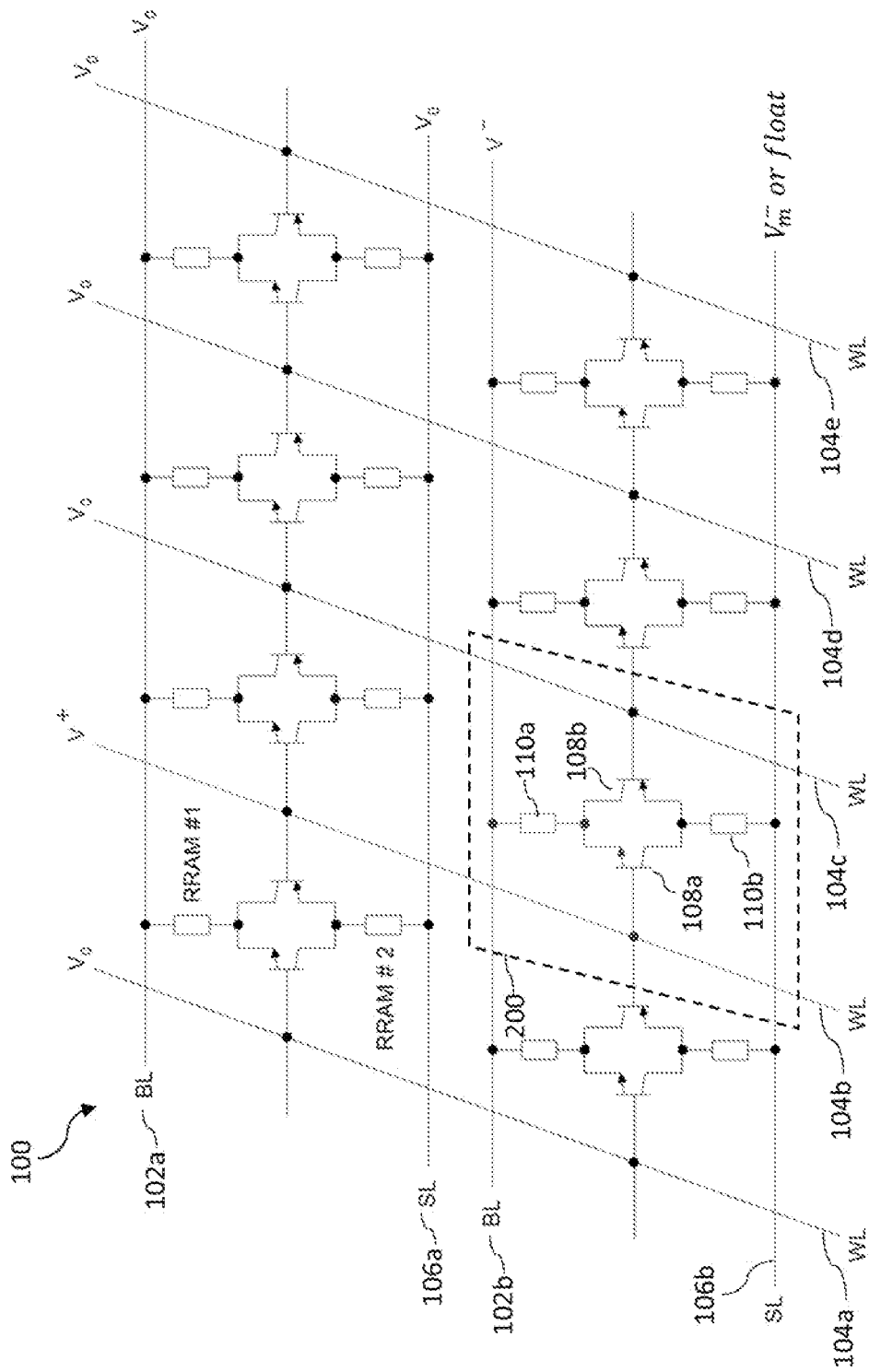
FIG. 3 is simplified circuit diagram of an erasing operation of the first memory element within the memory array according to an exemplary embodiment.

Referring now to FIG. 3, an example of an erase operation of the first memory element 110a within the memory array 100 is shown, in accordance with an embodiment. The erase operation is similar to the write operation with opposite voltage polarities transferred across the first memory element 110a. The write operation of the first memory element 110a, illustrated by FIG. 2, may be performed via the PNP BJT transistor 108b, whereas the erase operation of the first memory element 110a, illustrated by FIG. 3, may be performed via the NPN BJT transistor 108a.

The erase operation independently erases the state of only the first memory element 110a. All other memory elements, including the second memory element 110b within the memory cell 200, are substantially unaffected by this operation. To erase the state of the first memory element 110a, its resistance is increased. This is accomplished by applying a first erase voltage to the word line 104b. The word line 104b is connected to the transistor 108a. In an embodiment, if the transistor 108a is an NPN BJT transistor then the word line 104b is connected to the base of said NPN BJT transistor. In an alternative embodiment, if the transistor 108b is an nJFET transistor, then the word line 104b is connected to the gate of said nJFET transistor. The transistor 108a is connected to the first memory element 110a. The first erase voltage is a positive supply voltage $V^+$. In addition to the first erase voltage, a second erase voltage is applied to the bit line 102b. The bit line 102b is connected to the top terminal of the first memory element 110a. The second erase voltage is a negative supply voltage $V^-$. The first erase voltage is sufficiently larger than the second erase voltage to forward bias the base or the gate junction of the transistor 108b, allowing for the first memory element 110a to be selected to be erased. For example, if the voltage drop across the forward biased junction is approximately 0.7 volts (typical for a silicon p-n junction), the erase voltage selectively applied across the first memory element 110a will be approximately $V^+ - V^- - 0.7$ volts.

During the erasing of the first memory element 110a as described above, in order to minimize disturbing the second memory element 110b as well as all other memory elements in the rest of memory cells, a first and second intermediate voltages may be applied to certain parts of the memory array 100. In an embodiment, the first intermediate voltage is applied to the select line 106b that is connected to the second memory element 110b. In an alternative embodiment, the select line 106b is connected to a high impedance. The second intermediate voltage is applied to the remaining bit lines 102, word lines 104, and select lines 106. For example, as illustrated in FIG. 3, the select line 106b may either be connected to the first intermediate voltage $V_m^-$ or to a float, which refers to the high impedance. The second intermediate voltage, $V_0$, is applied to the bit line 102a, the select line 106a, and the word lines 104a, 104c, 104d, and 104e. As stated above, the first erase voltage $V^+$ is applied to the word line 104b and the second erase voltage $V^-$ is applied to the bit line 102b. In this example, voltages are chosen as follows:

$$V^+ > V_0 \geq V_m^- > V^-$$

As such, the first erase voltage is greater than the second intermediate voltage, the second intermediate voltage is greater than or equal to the first intermediate voltage, and the first intermediate voltage is greater than the second erase voltage. As a result, the bias voltages across all memory elements except the first memory element 110a are either negligible, or sufficiently smaller than $V^+ - V^-$ to not substantially alter their states. In one embodiment, $V_m^-$ and $V_0$ are both 0 volts (i.e. ground potential). In another embodiment, $V^+ = -V^-$. In yet another embodiment, the bit line 102a and/or the select line 106a are connected to a float (high impedance) instead of $V_0$. Further variations and bias configurations may also be contemplated. It should be appreciated that the $V^+$ and $V^-$ used for the erasing of a state of a memory element may be, and typically are, different from the $V^+$ and $V^-$ used for the writing of a state of a memory element. Further, other voltages $V_0$ or $V_m^-$ may also be different.

Figure 4:
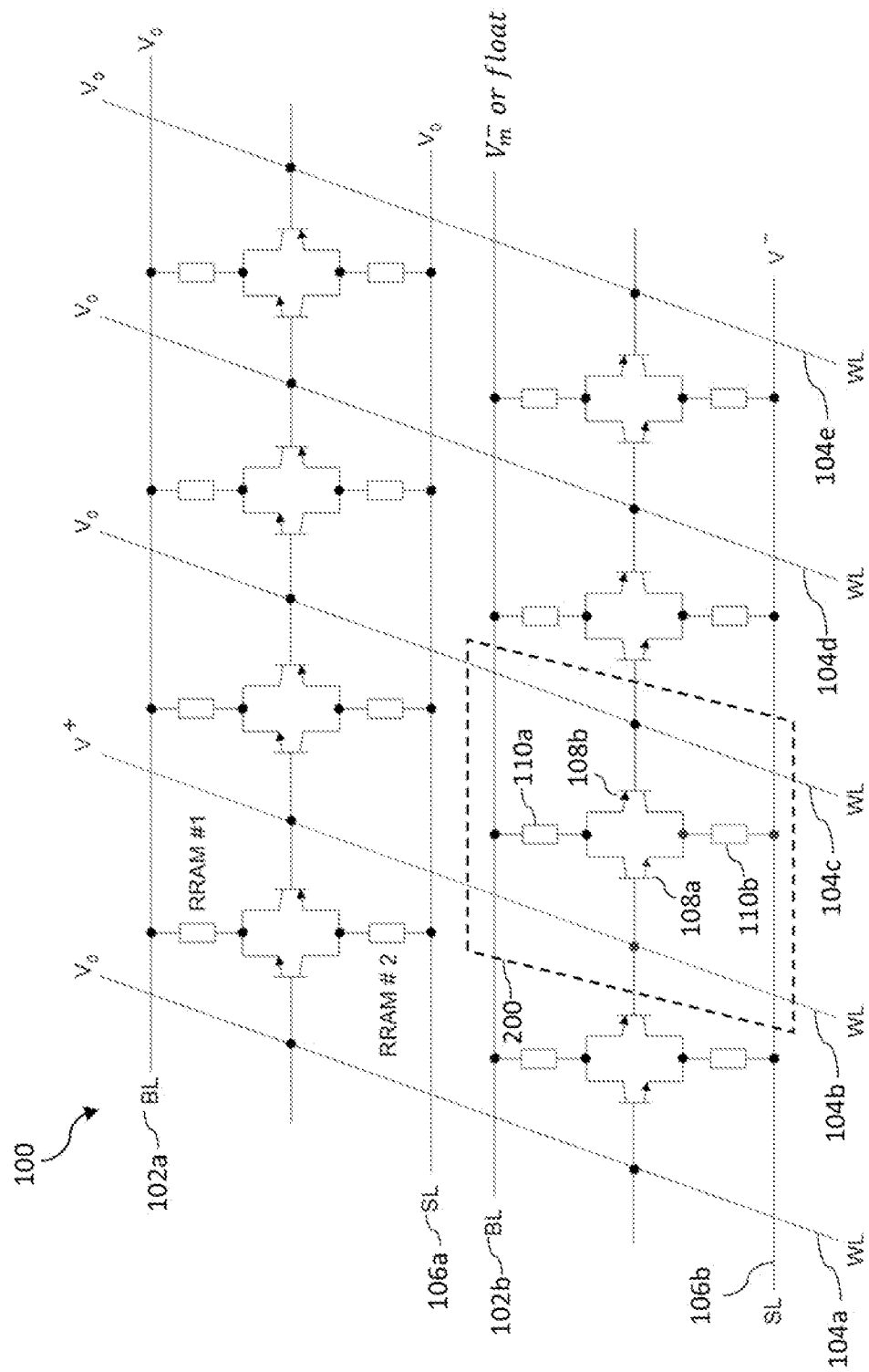
FIG. 4 is simplified circuit diagram of a programming operation of a second memory element within the memory array according to an exemplary embodiment.

Referring now to FIG. 4, an example of a writing operation of the second memory element 110b within the memory array 100 is shown, in accordance with an embodiment. The writing, or programming, of the second memory element 110b is similar to the writing operation of the first memory element 110a, described herein with reference to FIG. 2. In the example illustrated in FIG. 2 the first memory element 110a is written via the transistor 108b whereas, in the example, illustrated in FIG. 4, the second memory element 110b is written via the transistor 108a.

In an embodiment, in order to write, or program, the second memory element 110b without substantially disturbing the first memory element 110a within the memory cell 200, or any other memory element within the memory array 100, the first and second write voltages are applied to the word line 104b and the select line 106b, respectively. As described herein with respect to FIG. 2, the word line 104b may either be connected to the gate of an nJFET transistor 108a, or to the base of an NPN BJT transistor 108a. The transistor 108a is connected to the second memory element 110b. The select line 106b is connected to the bottom terminal of the second memory element 110b.

During the programming of the second memory element 110b, the first and second intermediate voltages may be applied to certain bit lines 102, word lines 104, and select lines 106. In an embodiment, the first intermediate voltage is applied to the bit line 102b, which is connected to the top terminal of the first memory element 110a. In an alternative embodiment, the bit line 102b is connected to a high impedance. The second intermediate voltage is applied to the rest of the bit lines 102, word lines 104, and select lines 106. For example, as illustrated in FIG. 4, the bit line 102b may either be connected to the first intermediate voltage $V_m^-$ or to a float, which refers to the high impedance. The second intermediate voltage, $V_0$, is applied to the bit line 102a, the select line 106a, and the word lines 104a, 104c, 104d, and 104e. As stated above, the first write voltage $V^+$ is applied to the word line 104b and the second write voltage $V^-$ is applied to the select line 106b. In this example, voltages are chosen as follows:

$$V^+ > V_0 \geq V_m^- > V^-$$

As such, the first write voltage is greater than the second intermediate voltage, the second intermediate voltage is greater than or equal to the first intermediate voltage, and the first intermediate voltage is greater than the second write voltage.

Having the first write voltage greater than the second write voltage allows for the second memory element 110b to be selected for the writing operation. The first write voltage is sufficiently larger than the second write voltage to forward bias the base or the gate junction of the transistor 108a. For example, the write voltage selectively applied across the second memory element 110b may be approximately $V^+-V^-$–0.7 volts. As such, the current flows through the base-emitter or gate-source junction of transistor 108a to the second memory element 110b. The transistor 108a acts as a two terminal device during this operation. When the current flows through the second memory element 110b, the second memory element 110b may be programmed to the desired state without substantially disturbing any other memory elements within the memory array 100 or the first memory element 110a within the memory cell 200. As such, the second memory element 110b may be independently programmed.

Figure 5:
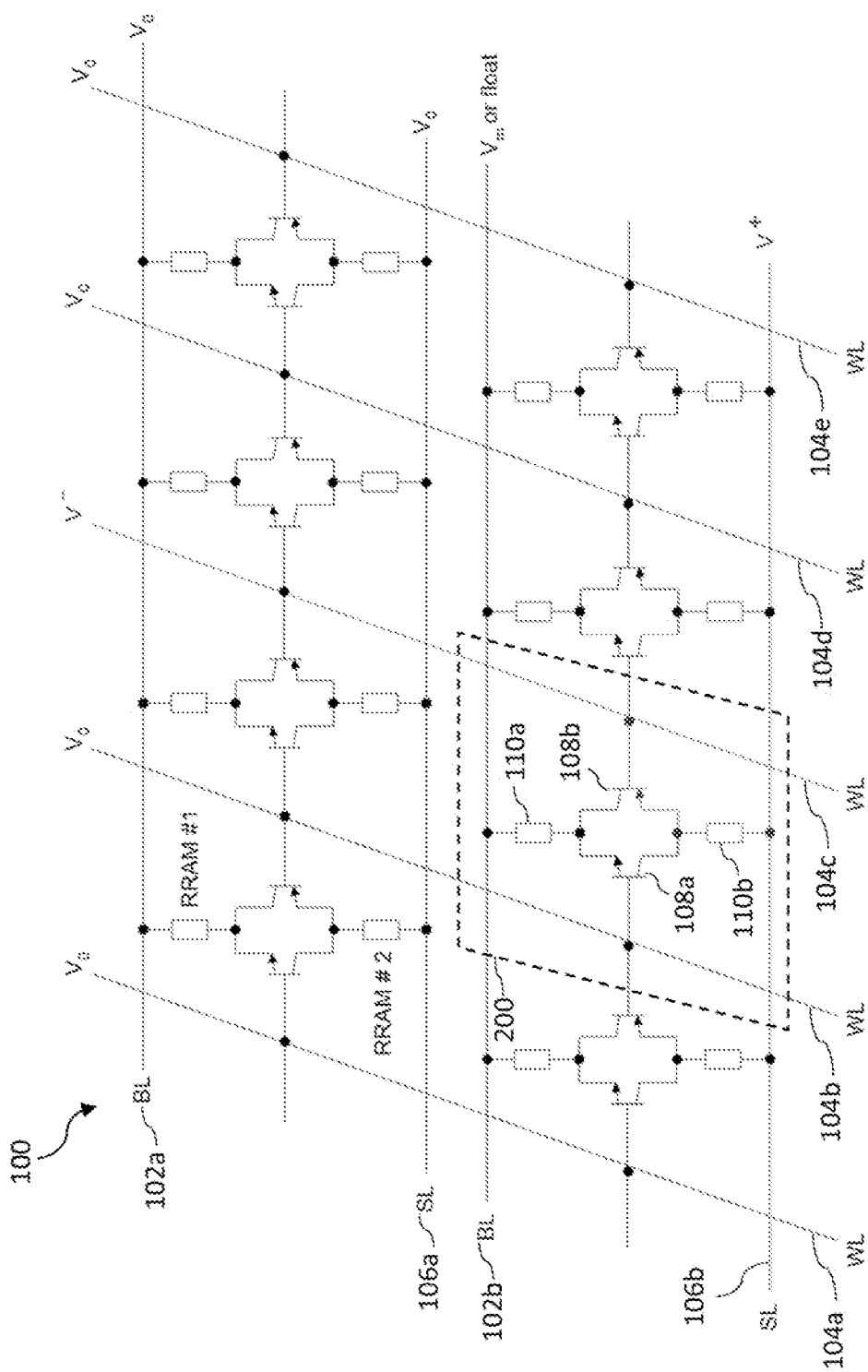
FIG. 5 is simplified circuit diagram of an erasing operation of the second memory element within the memory array according to an exemplary embodiment.

Referring now to FIG. 5, an example of an erase operation of the second memory element 110b within the memory array 100 is shown, in accordance with an embodiment. The erasing of the second memory element 110b is similar to the erasing operation of the first memory element 110a, described herein with reference to FIG. 3. In the example, illustrated in FIG. 3, the first memory element 110a is erased via the transistor 108a whereas, in the example, illustrated in FIG. 5, the second memory element 110b is erased via the transistor 108b. As stated above with respect to FIG. 3, embodiments of the present invention provide a method of independently erasing the state of one memory element within the memory array 100.

With continued reference to FIG. 5, to erase the state of the second memory element 110b, the first erase voltage V is applied to the select line 106b that is connected to the bottom terminal of the second memory element 110b, and the second erase voltage V is applied to the word line 104c. In an embodiment, the word line 104c is connected to the base of the PNP BJT transistor 108b. In an alternative embodiment, the word line 104c is connected to the gate of the pJFET transistor 108b. In both embodiments, the transistor 108b is connected to the second memory element 110b. The first erase voltage is sufficiently larger than the second erase voltage to forward bias the base or the gate junction of the transistor 108b. For example, the erase voltage selectively applied across the second memory element 110b may be approximately $V^+-V^-$–0.7 volts. As such, the current flows from the second memory element 110b through the emitter-base or source-gate junction of transistor 108b. The transistor 108b acts as a two terminal device during this operation. When the current flows through the second memory element 110b, the second memory element 110b may be erased to the desired state without substantially disturbing any other memory elements within the memory array 100 or the first memory element 110a within the memory cell 200. As such, the second memory element 110b may be independently erased.

In addition to the first and second erase voltages, the first and second intermediate voltages may also be applied to certain bit lines 102, word lines 104, and select lines 106. In an embodiment, the first intermediate voltage is applied to the bit line 102b, which is connected to the top terminal of the first memory element 110a. In an alternative embodiment, the bit line 102b is connected to a high impedance. The second intermediate voltage is applied to the bit line 102a, word lines 104a, 104b, 104d, 104e, and select line 106a.

In the example illustrated in FIG. 5, voltages are chosen as follows:

$$V^+ > V_m \geq V_0 > V^-$$

As such, the first erase voltage is greater than the first intermediate voltage, the first intermediate voltage is greater than or equal to the second intermediate voltage, and the second intermediate voltage is greater than the second erase voltage.

Figure 6:
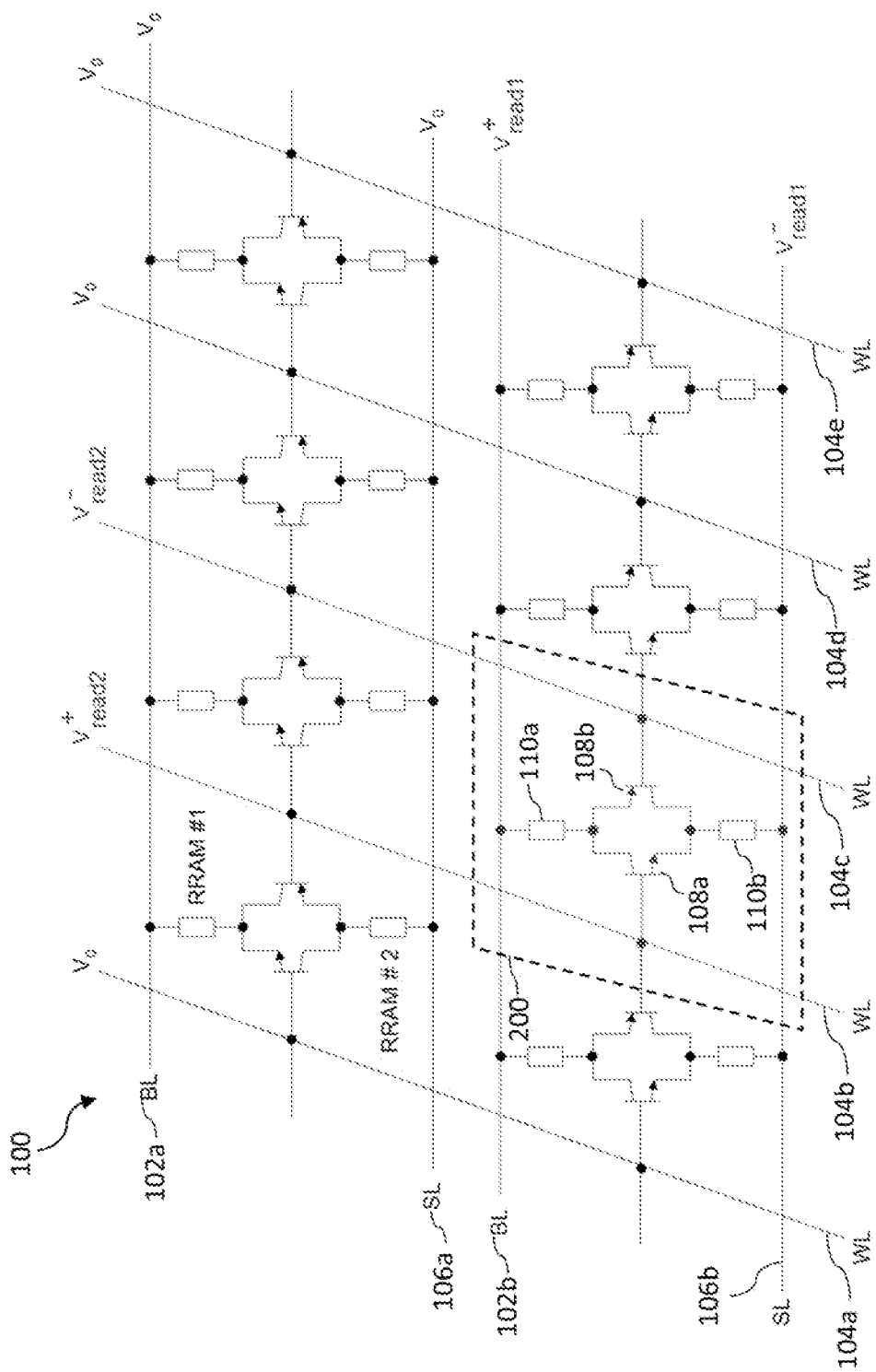
FIG. 6 is simplified circuit diagram of a reading operation of the memory cell within the memory array according to an exemplary embodiment.

Referring now to FIG. 6, an example of a reading operation of the memory cell 200 within the memory array 100 is shown, in accordance with an embodiment. In order to read the memory cell 200, two pairs of read voltages, with the right values in relation to each other, are applied to the memory array 100. The first pair of voltages may include a first read voltage, $V_{read\ 1}^+$, and a second read voltage, $V_{read\ 1}^-$. The second pair of voltages may include a first read voltage, $V_{read\ 2}^+$, and a second read voltage $V_{read\ 2}^-$. The first read voltage $V_{read\ 1}^+$ of the first pair of read voltages is applied to the bit line 102b that is connected to the first memory element 110a. The second read voltage $V_{read\ 1}^-$ of the first pair of voltages is applied to the select line 106b that is connected to the second memory element 110b. Further, the first read voltage $V_{read\ 2}^+$ of the second pair of read voltages is applied to the word line 104b that is either connected to the base of the NPN BJT transistor 108a, or to the gate of the nJFET transistor 108a. The second read voltage $V_{read\ 2}^-$ of the second pair of read voltages is applied to the word line 104c that is either connected to the base of the PNP BJT transistor 108b, or to the gate of the pJFET transistor 108b. In addition to the two pairs of read voltages, an intermediate voltage is also applied to the rest of the bit lines 102, word lines 104, and select lines 106. As such, bit line 102a, word lines 104a, 104d, 104e, and select line 106a are connected to the intermediate voltage. In some embodiments, the intermediate voltage $V_0$ is the ground voltage (i.e. zero volts).

In the example illustrated in FIG. 6 the read voltages are chosen as follows:

$$V_{read\ 1}^+ > V_{read\ 2}^+ > V_0 > V_{read\ 2}^- > V_{read\ 1}^-$$

As such, the first read voltage of the first pair of read voltages is greater than the first read voltage of the second pair of read voltages, the first read voltage of the second pair of read voltages is greater than the intermediate voltage, the intermediate voltage is greater than the second read voltage of the second pair of read voltages, and the second read voltage of the second pair of read voltages is greater than the second read voltage of the first pair of read voltages. During the read operation, transistors 108a and 108b are biased in the linear (triode) region and the read current flowing through the memory elements 110a and 110b and measured by the external circuitry is $$I_{read} = \frac{(V_{read1}^+ - V_{read1}^-) - V_{on}}{R_1 + R_2}$$

where $V_{On}$ is the voltage drop across the collector-emitter or drain-source of the parallel-connected transistors 108a and 108b, and $R_1$ and $R_2$ are the resistance values (i.e. previously programmed states) of the memory elements 110a and 110b, respectively. As known, $V_{On}$ is small in the triode region, particularly for a complementary pair of parallel-connected pass transistors; therefore, $$I_{read} \approx \frac{(V_{read1}^+ - V_{read1}^-)}{R_1 + R_2}$$

which is inversely proportional to $R_1+R_2$, the sum of the resistance values of the memory elements 110a and 110b. As such, $R_1+R_2$ can be extracted by the external circuitry. As will be explained below, $R_1+R_2$ may be interpreted as the state of the memory cell. The read voltages are chosen appropriately to obtain the bias conditions described above. For example, $V_{read\ 1}^+ - V_{read\ 2}^-$ is chosen sufficiently larger than the turn on voltage of the PNP BJT 108b or the threshold voltage of the pJFET 108b to provide the required overdrive, whereas $V_{read\ 1}^+ - V_{read\ 2}^+$ and $V_{read\ 1}^+ - V_0$ are not large enough to overdrive the PNP BJTs or pJFETs in the rest of memory cells. Similarly, $V_{read\ 2}^+ - V_{read\ 1}^-$ is chosen sufficiently larger than the turn on voltage of the NPN BJT 108b or the threshold voltage of the nJFET 108b to provide the required overdrive, whereas $V_{read\ 2}^- - V_{read\ 1}^-$ and $V_0 - V_{read\ 1}^-$ are not large enough to overdrive the NPN BJTs or nJFETs in the rest of memory cells.

In an embodiment, the first read voltage of the first and second pair of voltages is a positive voltage $V^+$ and the second read voltage of the first and second pair of voltages is a negative voltage $V^-$ having the same amplitude as the first read voltage. In another embodiment, the voltages are as follows:

$V_0$=0 V (ground)

$V_{read\ 1}^+ = V_{read\ 1}^-$ $V_{read\ 2}^+ = V_{read\ 2}^-$

It should be appreciated that read voltages are typically smaller than the write and erase voltages as known from a memory element operation.

As described above, during the reading of the memory cell 200, read voltages are applied with the use of the external circuitry such that the current flows through both the first memory element 110a and the second memory element 110b, and the read current sensed by the read circuitry is a measure of the combined states of the first and second memory elements 110a, 110b. As a result, the memory cell 200 can have a larger number of states when compared to a single memory element 110, as will be further explained below.

In addition, as described above, during the reading of the memory cell 200, both transistors 108a, 108b are turned on such that the transistors 108a, 108b form a complementary pass transistor pair, also known as a transmission gate. As known, this is advantageous since the transmission gate has a lower voltage drop and a higher dynamic range than a single pass transistor. Therefore, the read current measured by the external circuitry is substantially proportional to $R_1+R_2$, the sum of the resistance values of memory elements 110a and 110b, which may be interpreted as the state of the memory cell. In an embodiment, the first and second memory elements 110a, 110b and the transistors 108a, 108b may be configured as vertically stacked structures. For example, memory element 110a may be stacked on top of transistors 108a and 108b, which are in turn stacked in top of memory element 110b. In addition, transistors 108a and 108b may be vertical transistors with stacked transistor regions. These stacked structures minimize the footprint of the memory cell 200 and achieve a high density of memory states per area.

Embodiments of the present invention provide the memory array 110 that includes a plurality of memory cells 200. Each of the memory cells 200 includes two memory elements and two transistors. The memory cell 200 may be programed to a number of states larger than that of each of the memory elements. In some embodiments, a larger number of memory cell states may be possible if the first and second memory elements 110a, 110b, within the memory cell 200, have different characteristics. For example, if the first and second memory elements 110a, 110b are identical, and have a first state $R_H$ (denoting a high resistance) and a second state $R_L$ (denoting a low resistance), the memory cell 200 may have three states, $2R_H$, $2R_L$, and $R_H+R_L$. Similarly, if the first memory element 110a and the second memory element 110b have three states, $R_H$, $R_L$, and $R_M$ (denoting a medium resistance), there are six possible states $2R_H$, $2R_L$, $2R_M$, $R_H+R_L$, $R_H+R_M$ and $R_L+R_M$. More generally, if the two memory elements within the memory cell 200 are identical, and if the first memory element 110a and the second memory element 110b have N states, the memory cell 200 is programmable to $$\frac{N(N+1)}{2}$$

states. In this example, it is assumed that memory elements 110a and 110b are symmetric or otherwise biased with the same voltage polarities in the memory cell so that they have the same states as each other. As known, a memory element may be asymmetric where the polarities of the write and erase voltages affect the states of the memory element.

The memory cell 200 may have up to $N^2$ states for N bits when the first memory element 110a is different from the second memory element 110b. For example, by using different material compositions, thicknesses, and/or structure, the first memory element 110a may be different from the second memory element 110b. For example, if the first memory element 110a has two states $R_{H1}$ and $R_{L1}$, and the second memory element 110b has two states $R_{H2}$ and $R_{L2}$, the memory cell 200 may have four possible states: $R_{H1}+R_{H2}$, $R_{H1}+R_{L2}$, $R_{L1}+R_{H2}$ and $R_{L1}+R_{L2}$. Similarly, if the memory elements 110a and 110b are identical, but asymmetric and biased with opposite voltage polarities with respect to each other (e.g. if the bottom terminal of memory element 110a is connected to BL 102b and its top terminal connected to transistors 108a and 108b), the first memory element 110a may have two states $R_{H1}$ and $R_{L1}$, and the second memory element 110b may have two states $R_{H2}$ and $R_{L2}$, and the memory cell 200 may have four possible states: $R_{H1}+R_{H2}$, $R_{H1}+R_{L2}$, $R_{L1}+R_{H2}$ and $R_{L1}+R_{L2}$. More generally, with N states instead of two, the memory cell 200 may have up to $N^2$ states in this manner.

Embodiments of the present invention described herein with reference to FIGS. 1-6 provide a new circuit structure. The new circuit structure is the cross-point memory array 100 that includes a plurality of memory cells 200. The memory cells 200 may also be referred to as enhanced state dual memory cells. The memory cells 200 are 2T2R memory cells. As described herein above, each of the memory cells 200 includes two transistors 108a, 108b and two memory elements 110a, 110b. This combination of transistors and memory elements increases the effective number of states per cell when compared to a conventional memory array.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A circuit comprising:
   a memory array comprising
      a plurality of bit lines;
      a plurality of word lines;
      a plurality of select lines, the plurality of bit lines and the plurality of select lines intersect the plurality of word lines; and
      a plurality of memory cells each comprising
         a pair of transistors,
         a first memory element, and
         a second memory element, the first and second memory elements are connected to the plurality of word lines by way of the pair of transistors, the first and second memory elements are connected to the plurality of bit lines and the plurality of select lines,
   wherein the first memory element is connected between one of the plurality of bit lines and a first shared collector emitter or source drain terminal of the pair of transistors, and the second memory element is connected between one of the plurality of select lines and a second shared collector emitter or source drain terminal of the pair of transistors.

2. The circuit of claim 1, wherein the pair of transistors are a complementary pair of bipolar junction pass transistors, the complementary pair of bipolar junction pass transistors comprises an NPN bipolar junction pass transistor and a PNP bipolar junction pass transistor.

3. The circuit of claim 1, wherein the pair of transistors are a complementary pair of junction field-effect transistors, the complementary pair of junction field-effect transistors comprises an n-channel junction field-effect transistor and a p-channel junction field effect-transistor.

4. The circuit of claim 1, wherein one transistor of the pair of transistors and a transistor of an opposite channel type in a memory cell adjacent to the one of the plurality of memory cells have a base or a gate terminal connected to a same one of the plurality of word lines.

5. The circuit of claim 1, wherein the first memory element and the second memory element are a phase-change memory, a resistive random access memory, or a magnetic random access memory.

6. The circuit of claim 1, wherein the first memory element and the second memory element have same characteristics, the first memory element and the second memory element are programmable to N states and the memory cell is programmable to $$\frac{N(N+1)}{2}$$

states.

7. The circuit of claim 1, wherein the first memory element and the second memory element have different characteristics, the first memory element and the second memory element are programmable to N states and the memory cell is programmable to $N^2$ states.

8. A circuit comprising:
   a memory cell, the memory cell comprises a first memory element, a second memory element, a pair of transistors, the first memory element is connected between a bit line and a first shared collector emitter or source drain terminal of the pair of transistors, the second memory element is connected to between a select line and a second shared collector emitter or source drain terminal of the pair of transistors, the first transistor is connected to a first word line, and the second transistor is connected to a second word line.

9. The circuit of claim 8, wherein the first memory element is programmed by applying a first write voltage to the bit line, applying a second write voltage to the second word line, applying a first intermediate voltage to the select line, and applying a second intermediate voltage to the first word line.

10. The circuit of claim 9, wherein the select line is connected to a high impedance.

11. The circuit of claim 9, wherein the first write voltage is a positive supply voltage, the second write voltage is a negative supply voltage, and the first and second intermediate voltages are ground voltages.

12. The circuit of claim 9, wherein the first write voltage is greater than the first intermediate voltage, the first intermediate voltage is greater than or equal to the second intermediate voltage, and the second intermediate voltage is greater than the second write voltage.

13. The circuit of claim 8, wherein the first memory element is erased by applying a first erase voltage to the first word line, applying a second erase voltage to the bit line, applying a first intermediate voltage to the select line, and applying a second intermediate voltage to the second word line.

14. The circuit of claim 13, wherein the first erase voltage is a positive supply voltage, the second erase voltage is a negative supply voltage, and the first and second intermediate voltages are ground voltages, the first erase voltage is greater than the first intermediate voltage, the first intermediate voltage is greater than or equal to the second intermediate voltage, and the second intermediate voltage is greater than the second erase voltage.

15. The circuit of claim 8, wherein the pair of transistors are a complementary pair of bipolar junction pass transistors, the complementary pair of bipolar junction pass transistors comprises an NPN bipolar junction pass transistor and a PNP bipolar junction pass transistor.

16. The circuit of claim 8, wherein the pair of transistors are a complementary pair of junction field-effect transistors, the complementary pair of junction field-effect transistors comprises an n-type junction field-effect transistor and a p-type junction field effect-transistor.

17. The circuit of claim 8, wherein the first memory element and the second memory element are a phase-change memory, a resistive random access memory, or a magnetic random access memory.

\* \* \* \* \*